United States Patent [19]

Williams et al.

[11] Patent Number: 4,987,006
[45] Date of Patent: Jan. 22, 1991

[54] LASER TRANSFER DEPOSITION

[75] Inventors: Richard T. Williams, Winston-Salem; David B. Wrisley, Jr., Greensboro; Jeff C. Wu, Clemmons, all of N.C.

[73] Assignee: AMP Incorporated, Harrisburg, Pa.

[21] Appl. No.: 498,875

[22] Filed: Mar. 26, 1990

[51] Int. Cl.$^5$ ............................ B05D 3/06; B05D 5/12
[52] U.S. Cl. ........................................ 427/53.1; 427/96; 427/123; 427/125; 427/126.1
[58] Field of Search .................. 427/53.1, 42, 43.1, 427/248.1, 250, 123, 124, 125, 126.1, 96; 505/732

[56] References Cited

U.S. PATENT DOCUMENTS

| | | | |
|---|---|---|---|
| 3,964,389 | 6/1976 | Peterson | 427/53.1 |
| 4,245,003 | 1/1981 | Oransky et al. | 427/53.1 |
| 4,588,674 | 5/1986 | Stewart et al. | 346/76 L |
| 4,702,958 | 10/1987 | Itoh et al. | 346/76 L |
| 4,743,463 | 10/1988 | Ronn et al. | 427/53.1 |
| 4,895,735 | 1/1990 | Cook | 427/53.1 |

OTHER PUBLICATIONS

Roshon et al., "Printing by Means of a Laser Beam"; IBM Tech. Disc. Bull., vol. 7, #3, Aug. 1964.
Von Gutfeld, "Enhancing Ribbon Transfer Using Laser Printing", IBM Tech. Disc. Bull., vol. 17, #6, Nov. 1974.
Adrian et al., "A Study of the Mechanism of Metal Deposition by Laser-Induced Forward Transfer Process"; J. Vac. Sci. Tech. B5(5), Sep./Oct. 1987, pp. 1490-1494.
Alexander et al., "Laser Driven Micro-Explosive Bonding by Al Films to Cu and Si", J. of Mat. Sci. 23, (1988—No month given), pp. 2181-2186.

Primary Examiner—Norman Morgenstern
Assistant Examiner—Marianne Padgett
Attorney, Agent, or Firm—William B. Noll

[57] ABSTRACT

This invention is directed to a method for producing a smooth and continuous pressure bonded layer of a material such as gold or other precious metal, to a substrate, such as a metal substrate, through the driving force of a pulsed laser. The method comprises the steps of selecting a laser transparent substrate, applying thereto a thin polymeric film, where said polymer is characterized by a high optical coefficient of absorption to the wavelength of said laser. Preferably, such coefficient is at least $2 \times 10^4$ cm$^{-1}$. To the polymeric film, a thin layer or film of the material, such as gold is applied. Thereafter, the laser transparent substrate, containing the dual layers is placed in close proximity to the substrate or workpiece upon which such material is to be deposited. To this assembly, a pulsed laser is directed through the transparent substrate toward the polymeric film and material layer, whereby the laser energy is absorbed by the polymeric causing heating and vaporization thereof over a controlled depth of such polymer film. The vaporization provides the necessary pressure to blow-off the remaining polymer film and propel the material layer onto the substrate or workpiece. The resulting pressure bonded layer, i.e. gold or other precious metal, is smooth and continuous.

8 Claims, 1 Drawing Sheet

LASER TRANSFER DEPOSITION

RELATED APPLICATION

The present invention, directed to a process of material deposition or dry plating, by a laser transfer technique, is an improvement over the process taught in U.S. patent application Ser. No. 895,987.

BACKGROUND OF THE INVENTION

In the field of plating metal substrates, for example, particularly a process for plating with a precious metal such as gold, selectively controlling the deposition of such plating metal is a significant cost saving step, often representing the difference between a commercially feasible process and a mere laboratory phenomenon.

The known processes fall within two generally accepted categories: wet plating and dry plating. Electroplating is a wet plating process. The process is most commonly carried out by forming an electrical circuit between the metallic workpiece and a spaced electrode, all while located in a liquid bath containing the material to be plated out. Note U.S. Pat. No. 4,427,498 to Wagner and U.S. Pat. No. 4,534,843 to Johnson, et al.

These conventional electroplating processes can be quite costly and complicated, and can be hazardous. Waste treatment and disposal are also significant practical problems. Further complications ensue when conventional electroplating is used for selective depositing of the metal onto predetermined areas of the workpiece. Furthermore, recycling of expensive unused gold can lead to problems.

There are other conventional techniques for depositing a noble metal such as gold on a substrate. Evaporation of gold contacts is in principle a dry plating or deposition alternative to wet electroplating. It is not considered practical, however, because conventional methods require high vacuum, deposit unnecessary gold which requires extensive recycling, are not easy to turn on and off for spot evaporation without heavily caking a shutter. Furthermore, conventional boat evaporation of certain alloy compositions needed for wear resistance may be difficult. The shortcomings of this technology illustrate the need for a method of deposition, in only specifically defined areas, with well-controlled thickness and the ability to maintain stoichiometry of the plating alloy.

A related dry method of gold deposition is suggested by the widespread use of pressure bonding of gold wires to pads in microelectronics packaging. Although this works for wires, it is not apparent how to apply the required pressure to a gold layer up to $30\mu''$ in such a way as to effect transfer to the intended stock.

Published patents and articles disclose further wet processing technology which use a pulsed energy beam, such as a laser, for selective electroplating. Note, for example, U.S. Pat. No. 4,217,183 to Melcher, et al; U.S. Pat. No. 4,239,789 to Blum, et al; U.S. Pat. No. 4,349,583 to Kulynych, et al; U.S. Pat. No. 4,432,855 to Romankiw, et al; U.S. Pat. No. 4,497,692 to Gelchinski, et al; and U.S. Pat. No. 4,511,595 to Inoue, as well as the technical publication Laser Enhanced Electroplating and Maskless Pattern Generation by R. J. von Gutfield appearing in the Applied Physics Letters, 35 (9), 1 November 1979, page 651. For example, the disclosure of Kulynych, et al. teaches that laser thermal agitation of the dipole layer adjacent the substrate in wet plating can produce accelerated plating where the laser strikes. However, this is generally too slow for macroscopic devices, such as switch contacts, because of the inherent inability to transport plating ions to the intended spot fast enough, and does not avoid the use of wet plating solutions.

Another example of laser processing is taught by Ehrlich, Osgood, and Deutsch in U.S. Pat. Nos. 4,868,005 and 4,615,904. Laser assisted chemical vapor deposition (LCVD) as described therein operates by means of a local laser-heated spot on the substrate pyrolizing organometallic constituents of a carrier gas, or direct laser dissociation of the organometallic molecules above the intended spot for plating. Again, this is too slow for most macroscopic applications, because of problems transporting and decomposing the organometallic fast enough.

Further, in a related area of technology, as described in U.S. Pat. No. 4,281,030 to Silfvast, a recipient surface is preheated as by a laser source in a predetermined pattern to facilitate the attachment of flux flowing adjacent the recipient surface. Similar technology is disclosed in U.S. Pat. No. 3,650,796 to Jackson, et al. and in U.S. Pat. No. 4,042,066 to Engl, et al. These two patents disclose pasting a thermally decomposable metal onto a recipient surface which is pyrolyzed in a predetermined pattern for forming an essentially plated surface. Pyrolizing, however, is inconvenient since it always requires a paste, a wet process itself, and line resolution is less.

Another similar technology is described in the literature for producing a thin, transparent layer of uniform thickness on a recipient surface. Note U.S. Pat. No. 4,571,350 to Parker, as well as Vacuum Deposited Thin Films Using a Ruby Laser, by Smith, et al, found in Applied Optics, Volume 4, Number 1, January 1965, Page 147; Pulsed Laser Evaporated $SnO_2$ layer in the Journal of Crystal Growth, 56 (1982) page 429, North-Holland Publishing Company; Thin Films Made with Lasers by Nancy Stauffer found in the MIT Report, July/August 1984, Volume XII Number 7, Page 1; and Deposition of Amorphous Carbon Films from Laser Produced Plasmas by Marquardt, et al. in Mat. Res. Soc. Symp. Proc. Volume 38, 1985 Materials Research Society. Such disclosures, however, do not allow for selectivity when plating on a recipient surface.

U.S. Pat. No. 3,560,258 to Brisbane, IBM Technical Disclosure Bulletin, Vol. 8, No. 2, July 1965 to Potts, and U.S. Defensive Publication T988-007 to Drew disclose transfer methods employed for different applications. While these last disclosures relate to a dry technique for depositing material on recipient surfaces as with laser, all describe evaporation of the material in a vacuum enclosure. But more importantly, such methods lack spatial selectivity, or controlled geometry.

In U.S. Pat. No. 4,752,455 to Mayer, there is disclosed a pulsed laser transfer technique for transferring a metal film on a glass, i.e., transparent substrate to a target area of an electrically conductive material adjacent thereto. That is, pulsed laser energy is directed through the transparent substrate onto the conductive film at a sufficient intensity and for a sufficient duration to rapidly vaporize the metal film. The target materials are driven by film vaporization energy and by the reaction thereof against the glass substrate onto the opposing or object surface of a second substrate. See also the report by J. Bohandy et al. in the J. Appl. Phys., Vol. 60, No. 4, Aug. 15, 1986, entitled, "Metal Deposition From a Supported Metal Film Using an Excimer Laser".

A shortcoming of the above processes is the inability to control the uniformity and structural integrity of the deposited metal film. From experimental work by the inventors hereof, it was determined that in following such processes, the resulting film deposits were always nodular or grainy, and often discontinuous in thinner films, as if they had broken up in a molten or vapor phase and had coalesced again into droplets, islands, or crystallites. The appearance of such films of gold was lighter in color than normal, and "dusty". If the transfer had been made at very high laser power density, and at atmospheric pressure, the gold film would have been black, due to its colloidal nature. Thick gold films may be reflowed by a second laser pulse to provide continuous rough polycrystalline coverage, but smooth continuous films comparable to evaporated or electroplated gold are not produced by the processes of Mayer or Bohandy et al. It is theorized that the problem may have to do with the high rate of arrival of the deposited atoms (ions) on the surface of the workpiece, and the corresponding high density of metal vapor just above the workpiece surface. As a consequence, there is coalescence above or on the surface of metal into droplets or thick islands. In other words, the reason for discontinuous films by such earlier methods may be due to a combination of effects of turbulence in the driving vapor, coupled with absence of mechanical strength in the molten gold (or very poor mechanical strength even if some of the gold remains solid), and tendency of molten or dense vapor gold on or above the substrate surface to form gold clusters rather than fully wetting the substrate. Contrast this to gold evaporation, for example. Gold evaporation produces smooth mirror surfaces, because the atoms arrive individually or in very small clusters in a random distribution on a cool substrate, and stick very close to where they hit. Similarly, electroplated atoms arrive and attach essentially at random. Although nucleation sites are involved in both processes, there are sufficiently many of them and the range of the gold is sufficiently limited that smooth films result.

The present invention avoids such shortcoming by the provision of including a highly absorptive polymer layer intermediate the transparent substrate and metal film to be transferred. That is, this invention relies upon a different physical interaction of the laser and the metal, effected by incorporation of a polymer layer to protect the metal and provide lateral strength during the violent transfer. While it is conceded that single-shot deposition of molten or vaporized gold pushed by a possibly turbulent expanding hot vapor will not produce films as smooth and continuous as evaporated films, the present invention nevertheless teaches a method to transfer smooth continuous films previously formed by conventional evaporation or sputtering, rolling, or other methods, to yield a smooth film, such that the original properties are retained. That is, this method relies on a strong polymer film to provide lateral strength to the thin gold, to protect the gold from hot vapor and direct laser heating, and to itself provide the material to be vaporized by the laser. The invention hereof, particularly the role of such polymer layer, will become apparent in the description which follows.

SUMMARY OF THE INVENTION

The present invention relates to a process for depositing a material, preferably a metal onto a substrate by the use of a pulsed laser directed against a polymer film, highly absorptive at the wavelength of such laser, to propel the material to be deposited against said substrate. In a preferred practice of this invention, metal is transferred in solid form by utilizing the supporting polymer film to maintain the integrity of the metal during such transfer. More particularly, the invention hereof is characterized by the steps of providing a glass or transparent substrate upon which is found a first layer or film of a polymer, where said polymer is highly absorptive of the given wavelength of a pulsed laser, and a second layer or film thereover of a metal to be transfer plated, positioning a workpiece or metal substrate disposed near said second layer or film, and directing the beam of pulsed laser through said glass or transparent substrate to at least partially ablate and vaporize said polymer to provide a driving force to propel a portion of said second layer or film toward said metal substrate, whereby said second layer or film is pressure bonded to said metal substrate. While the preferred process hereof relates to the deposition of a metal onto a substrate, where such metal is supported by a laser opaque member, it should be understood that the material to be deposited may be a conductive, semiconductive, superconductive or insulative material. Further, the carrier or support member may be a polymer, where such polymer is of a thickness and type where the laser light is mostly absorbed before reaching the material to be deposited. That is, approximately half of the polymer is vaporized, the other half remaining an intact film support for the material to be deposited. A strong polymer is used so that the expanding vapor cannot punch through in local areas and destroy film continuity, such as by melting.

DETAILED DESCRIPTION OF THE PREFERRED EMBODIMENT

Figure 1:
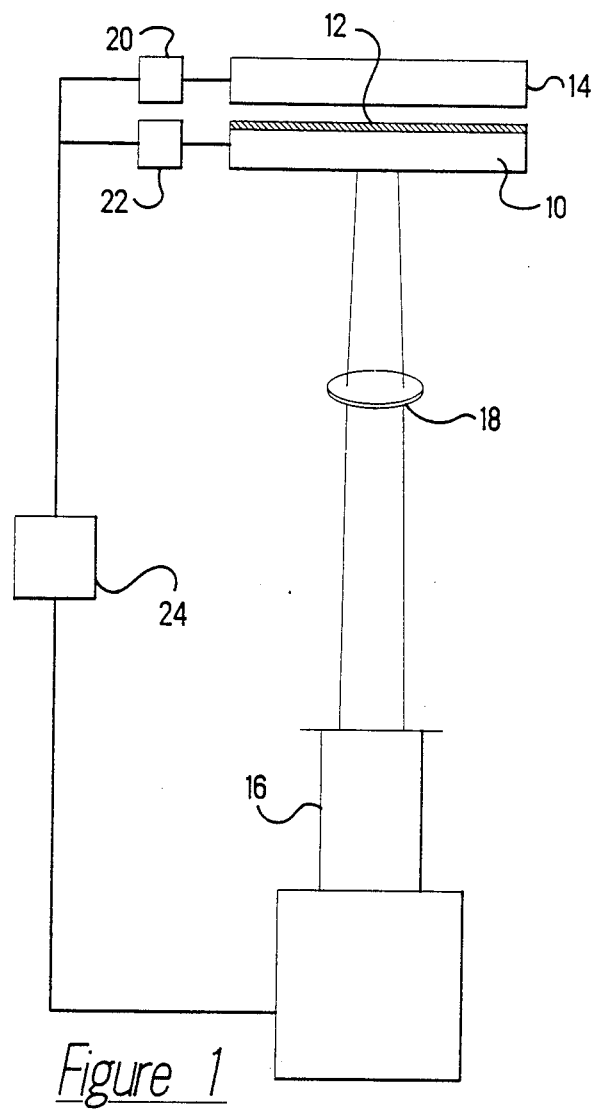
FIG. 1 is a schematic illustrating the process of laser transfer plating according to this invention.

The present invention is directed to a process for laser transfer deposition of a material, preferably a metal such as a precious metal, onto a substrate, preferably metallic. The invention hereof, utilizing a polymer layer or film to assist in propelling such deposition metal, overcomes many of the shortcomings of prior art selective plating or deposition practices.

In the preferred practice of this invention, as illustrated schematically in the several Figures, a thin polymer carrier film, such as polyimide, is deposited onto a laser-transparent, preferably flexible, substrate, such as polystyrene, polyvinyl acetate, PMMA or polyethylene. Glass, quartz, or sapphire may also be used, but prolonged use or high laser power may result in damage thereto. Further, for cost effectiveness, an expendable carrier or support, such as the laser transparent polymers above, all of which preferably exhibit an optical coefficient of absorption of less than about $10^1$ cm$^{-1}$, is preferred. Over such composite, which in a preferred case may comprise a thin polyimide layer on a thicker polymer substrate, such as polystyrene, a smooth continuous precious metal film, i.e. gold, is deposited. This deposition may be by evaporation, sputtering, or other non-selective methods as known in the art. With the workpiece, preferably a metal substrate to be plated, placed near the precious metal film, a short laser pulse (e.g. excimer) shaped optically to the desired shape of the deposit then vaporizes a portion of the thickness of the polymer carrier film, which is opaque to the laser wavelength. The vapor blow-off drives the remainder of the polymer film thickness, carrying the solid gold film, at very high pressure against the metal, causing pressure bonding. That is, the expanding vapor drives such remaining polymer and the gold on it onto the substrate to be covered, which preferably had been placed adjacent the gold, at a rather high pressure (estimated about 10 kilobar). This action causes pressure bonding of the gold film to the substrate metal. The lateral structure and thickness profile of the gold deposit retain the desirable properties of the evaporated or rolled starting film, because the polymer provides lateral strength during transfer. This is in contrast to earlier methods where the laser heats the metal, typically gold, to melting or above, in which case it loses all mechanical strength. Such earlier methods often resulted in rough, porous and discontinuous films. Where such deposited gold, as applied by such prior art methods, is intended for use as an electrical contact, on a terminal for example, electrical conductivity is impaired, and porosity poor. Finally, to the extent that any polymer film remains on the deposited metal, i.e. gold, it may be readily removed or stripped by procedures known in the art.

Turning now to the Figures, the source of material to be transferred is a transparent source plate or substrate 10, namely, one that is transparent to the laser wavelength, bearing a dual layer 12 formed of a thin polymer film 12a adjacent the substrate 10, and an overlying film 12b of the material, such as precious metal, namely gold or other noble metal. The noble metal layer is placed in operative proximity to, close to or in contact with, a workpiece 14 to be plated. In a preferred embodiment, the workpiece 14 may be an electrically conductive material such as nickel, nickel plated, or other electrically equivalent metal. The separation is significantly smaller than the smallest transverse dimension of the pattern to be deposited, and preferably in tight contact. A pulse from a laser 16 incident through the transparent substrate is absorbed by the polymer film. In a preferred embodiment thereof, the resulting energy build-up therein causes the remaining polymer to ablate propelling the metal, preferably a noble metal, toward the workpiece 14 to cause pressure bonding of such noble metal to said workpiece 14.

By this practice, vaporization of the noble metal is avoided. More precisely, a key aspect of the process hereof is that solid gold of a specified spatial pattern and thickness can be projected at very high velocities onto the workpiece, typically nickel, so that pressure bonding at the interface may occur. Since the noble metal is never vaporized or melted in that case, aspects of structure, such as smoothness, continuity, composition or multiple layers that were present in the noble metal film or layer before transfer, can be maintained.

Continuing with the operational set-up illustrated in FIG. 1, the transverse spatial extent of the noble metal transfer is defined by the shape and extent of the laser spot illuminating the substrate. The laser spot can be shaped by a mask in the beam path or preferably by an optical or other imaging system 18, as known in the art. The transverse spatial extent of the transferred material is preserved by proximity of source and workpiece. In use, the substrate and workpiece may be clamped in contact for concurrent movement with respect to the laser spot with motor means provided to effect their preprogrammed motion. In the preferred mode of operation, however, the substrate and the workpiece would be preprogrammed for movement with respect to each other for single or multiple transfers, and motor means 20 and 22 would be individually provided to effect the preprogrammed motion. In this embodiment, the laser spot could be moved with respect to one or both of the movable members in the plating zone. A programmable controller 24 is used to coordinate the various motor means as well as the operation and movement of the laser spot. The resulting plated area would thus normally be formed of a series of coterminus transferred dots. In other uses, the laser spot would be preprogrammed for movement with respect to the clamped substrate and workpiece.

Figure 2A:
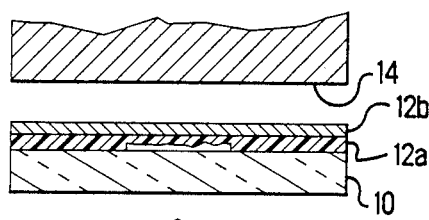
FIGS. 2a and 2b, respectively, are enlarged schematics illustrating an intermediate position and a final position in carrying the process hereof.
Figure 2A:
Figure 2B:
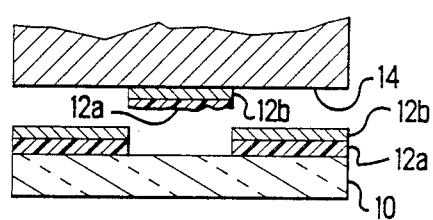
Figure 2B:

The sequence illustrated in FIGS. 2a and 2b represents the preferred practice of this invention. In such practice, a pulsed laser, the beam of which is illustrated in said Figures, is directed toward and through the source plate 10, and initially into the polymer layer 12a. It should be noted at this juncture that an excimer laser is the preferred laser source, even though other lasers may be employed. As known, in the field of laser applications there are several commercial units which operate at different wavelengths. For example, excimer lasers form a group of pulsed high-pressure gas lasers which emit various ultraviolet wavelengths, depending on the lasing medium, such as 193 nm, 248 nm, 308 nm and 351 nm. At the opposite end of the spectrum, operating in the infrared region are such lasers whose laser sources are carbon dioxide ($CO_2$), and neodymium doped yttrium-aluminum garnet (Nd:YAG). By way of example and comparison, typical wavelengths for the three commercial laser units are as follows:

| Excimer | 193, 248, 308, 351 nm |
|---------|-----------------------|
| $CO_2$  | 10,600 nm             |
| ND:YAG  | 1,064 nm              |

The specific polymer film 12a used in the practice of this invention is one which is highly absorptive or opaque to the laser wavelength. This is in sharp contrast to the process of selective laser ablation of a plating resist as taught in U.S. Pat. No. 4,877,644. It is imperative for the latter process to employ a polymer film that is transparent to the laser wavelength. A preferred practice thereof is to use a polymer plating resist having an optical coefficient of absorption no greater than about 1000 $cm^{-1}$ for a film thickness of about 3 microns.

Listed in Table I are a number of polymers exhibiting a range of coefficients of absorption for selected wavelengths of an excimer laser.

TABLE I

ABSORPTION COEFFICIENTS OF SELECTED POLYMERS AT VARIOUS WAVELENGTHS ($cm^{-1}$)

| Polymer | Wavelength | | |
|---------|---|---|---|
|  | 193 nm | 248 nm | 308 nm |
| Polyimide | $4.2 \times 10^5$ | $2.8 \times 10^5$ | $1.2 \times 10^5$ |
| Polysulfone | $4.0 \times 10^5$ | $1.5 \times 10^5$ | $8.1 \times 10^2$ |

TABLE I-continued
ABSORPTION COEFFICIENTS OF SELECTED POLYMERS AT VARIOUS WAVELENGTHS ($cm^{-1}$)

| Polymer | Wavelength | | |
|---|---|---|---|
| | 193 nm | 248 nm | 308 nm |
| Novolac epoxy | $1.0 \times 10^5$ | $2.1 \times 10^4$ | $2.4 \times 10^3$ |
| Polycarbonate | $5.5 \times 10^5$ | $1.0 \times 10^4$ | $2.2 \times 10^1$ |
| Poly(a-methyl)styrene | $8.0 \times 10^5$ | $6.5 \times 10^3$ | $8.0 \times 10^1$ |
| Poly(methyl-methacrylate) | $2.0 \times 10^3$ | $6.5 \times 10^1$ | $<10^1$ |
| Poly(vinylacetate) | $1.0 \times 10^3$ | $<10^2$ | $<10^1$ |
| Polyethylene | $6.3 \times 10^2$ | $<10^1$ | $<10^1$ |
| Polypropylene | $5.3 \times 10^2$ | $<10^1$ | $<10^1$ |
| Polytetrafluoroethylene | $2.6 \times 10^2$ | $1.4 \times 10^1$ | $<10^1$ |

Source: "Laser Photoetching of Polymers" by Cole et al., Mat. Res. Symp. Proc. Vol. 72, 1986 Materials Research Society In order that reasonable laser pulses deliver sufficient energy density to effect vaporization at high temperatures, for an excimer laser operating in the above noted wavelengths, the selected polymer should exhibit a coefficient of absorption of at least $2 \times 10^4$ $cm^{-1}$. Clearly, the preferred candidate from the list above is polyimide, acceptable over a range of laser wavelengths.

By the use of a highly absorptive polymer, the energy from a single excimer shot or pulse will be initially absorbed by the polymer layer causing heating and vaporization of a portion thereof, see FIG. 2a. This results in a build up of pressure causing a vapor blow-off driving the overlying metal film 12b and supporting polymer film 12a against the substrate 14 resulting in pressure or pressure bonding of the metal film 12b to said substrate.

In a preferred example of this invention, an XeCl excimer laser, producing $7J/cm^2$ in a 10 ns pulse, was imaged to the desired shape and area on the carrier film adjacent a metal substrate. The carrier film was self-supporting polyimide about 0.0005" thick, where the absorption coefficient of polyimide at 308 nm is $1.2 \times 10^5$ cm. The polymer carries about 20 microinches of gold previously deposited on the polyimide by evaporation. This resulted in a much smoother and more continuous gold film on the metal substrate.

The resulting transferred films, especially gold, were found to be fairly adherent when transferred to nickel in air. For air transfer, the nickel surfaces should be cleaned by electrochemical cathodic agitation, acid pickling, rinsing in de-ionized water and blown dry in clean air. The gold surface should be cleaned by flowing acetone. Transfer in vacuum with vacuum-cleaned surfaces will produce even more adherent films, or do so with less laser energy density. The preferred embodiment would have the gold or nickel both pre-cleaned by glow discharge in low pressure argon or reducing atmosphere, then joined and laser bonded in the same environment, or similarly controlled environment.

We claim:

1. In a method for producing a smooth and continuous pressure bonded layer of a material, selected from the group consisting of conductive, semiconductive, superconductive and insulating materials, on a base material through the driving force of a pulsed laser, the improvement comprising in combination therewith the steps of
   (a) selecting a laser transparent substrate,
   (b) applying thereto a thin polymeric film, where said polymer is characterized by a high optical coefficient of absorption to the wavelength of said laser,
   (c) applying to said polymeric film a thin layer of said material for pressure bonding to said base material,
   (d) placing said base material in close proximity to said thin layer of material, and
   (e) directing pulsed laser energy through said transparent substrate toward said polymeric film and said layer of material to be pressure bonded, whereby said laser energy is absorbed by said polymer causing heating and vaporization thereof to a controlled depth of said polymeric film, leaving remaining portions of said polymeric film unvaporized after said depth, to act as support for said thin layer of material to be pressure bonded, said vaporization providing the necessary pressure to blow-off said remaining portions of polymeric film, whereby to propel said material for pressure bonding on to said base material.

2. The method according to claim 1 wherein said material to be pressure bonded is gold, a gold alloy, palladium, or palladium alloy.

3. The method according to claim 1 wherein the method is practiced in a controlled environment to minimize oxidation of said material to be bonded and base material.

4. The method according to claim 1 wherein the material to be bonded is non-oxidizing and is conducted in an air environment.

5. The method according to claim 1 wherein said laser transparent substrate is a member selected from the group consisting of glass, quartz and sapphire.

6. The method according to claim 1 wherein said laser transparent substrate is a polymer having an optical coefficient of absorption of less than about $10^1$ $cm^{-1}$.

7. The method according to claim 2 wherein the base material is a metal.

8. The method according to claim 1 wherein said laser is an excimer laser and said polymeric film has an optical coefficient of absorption of at least $2 \times 10^4 cm^{-1}$.

* * * * *